United States Patent
Wojtczuk et al.

(10) Patent No.: US 7,955,965 B2
(45) Date of Patent: Jun. 7, 2011

(54) NANOPHOTOVOLTAIC DEVICES

(75) Inventors: Steven J. Wojtczuk, Lexington, MA (US); James G. Moe, Sudbury, MA (US); Roger G. Little, Bedford, MA (US)

(73) Assignee: Spire Corporation, Bedford, MA (US)

( * ) Notice: Subject to any disclaimer, the term of this patent is extended or adjusted under 35 U.S.C. 154(b) by 0 days.

(21) Appl. No.: 12/851,893

(22) Filed: Aug. 6, 2010

(65) Prior Publication Data

US 2010/0297803 A1 Nov. 25, 2010

Related U.S. Application Data

(60) Continuation of application No. 12/388,895, filed on Feb. 19, 2009, now Pat. No. 7,772,612, which is a division of application No. 11/002,850, filed on Nov. 30, 2004, now Pat. No. 7,514,725.

(51) Int. Cl.
*H01L 21/44* (2006.01)

(52) U.S. Cl. .......................... 438/597; 136/249; 257/103

(58) Field of Classification Search .................. 257/103; 136/249; 438/597, 586
See application file for complete search history.

(56) References Cited

U.S. PATENT DOCUMENTS

| | | | |
|---|---|---|---|
| 4,118,485 A | 10/1978 | Eriksson et al. | |
| 4,673,584 A | 6/1987 | Nygren et al. | |
| 5,057,313 A | 10/1991 | Shih et al. | |
| 5,142,385 A | 8/1992 | Anderson et al. | |
| 5,155,051 A | 10/1992 | Noguchi et al. | |
| 5,782,908 A | 7/1998 | Cahalan et al. | |
| 6,066,204 A | 5/2000 | Haven | |
| 6,080,928 A | 6/2000 | Nakagawa | |
| 6,084,175 A | 7/2000 | Perry et al. | |
| 6,287,765 B1 | 9/2001 | Cubicciotti | |
| 6,319,738 B1 | 11/2001 | Yamashita | |
| 6,399,177 B1 | 6/2002 | Fonash et al. | |
| 6,406,745 B1 | 6/2002 | Talton | |
| 6,444,897 B1 | 9/2002 | Luque-Lopez et al. | |
| 6,566,595 B2 | 5/2003 | Suzuki et al. | |
| 6,584,130 B2 | 6/2003 | Hanke | |
| 6,689,338 B2 | 2/2004 | Kotov | |
| 6,750,016 B2 | 6/2004 | Mirkin et al. | |
| 6,756,477 B1 | 6/2004 | Jiang et al. | |
| 6,774,300 B2 | 8/2004 | McFarland | |
| 6,952,024 B2 * | 10/2005 | Edmond et al. | 257/97 |
| 7,122,734 B2 * | 10/2006 | Fetzer et al. | 136/252 |
| 7,227,066 B1 | 6/2007 | Roscheisen et al. | |
| 7,514,725 B2 | 4/2009 | Wojtczuk et al. | |

(Continued)

OTHER PUBLICATIONS

Appelbaum, FR, "Antibody-targeted therapy for myeloid leukemia," Semin Hematol, 36 (4 Suppl 6): 2-8 (Oct. 1999).

(Continued)

*Primary Examiner* — Thao Le
(74) *Attorney, Agent, or Firm* — Thomas J. Engellemmer; Reza Mollaaghababa; Nutter McClennen & Fish LLP (57) ABSTRACT

The present invention provides nanophotovoltaic devices having sizes in a range of about 50 nm to about 5 microns, and method of their fabrication. In some embodiments, the nanophotovoltaic device includes a semiconductor core, e.g., formed of silicon, sandwiched between two metallic layers, one of which forms a Schottky barrier junction with the semiconductor core and the other forms an ohmic contact therewith. In other embodiment, the nanophotovoltaic device includes a semiconductor core comprising a p-n junction that is sandwiched between two metallic layers forming ohmic contacts with the core.

8 Claims, 7 Drawing Sheets

U.S. PATENT DOCUMENTS

| | | | |
|---|---|---|---|
| 7,772,612 B2 | 8/2010 | Wojtczuk et al. | |
| 2003/0010973 A1 | 1/2003 | Lorin et al. | |
| 2004/0051108 A1* | 3/2004 | Nortrup | 257/82 |
| 2004/0075083 A1 | 4/2004 | Li et al. | |
| 2004/0101822 A1 | 5/2004 | Wiesner et al. | |
| 2004/0154657 A1 | 8/2004 | McFarland | |
| 2004/0159842 A1* | 8/2004 | Edmond et al. | 257/79 |
| 2005/0000565 A1 | 1/2005 | Zeng | |
| 2005/0087224 A1 | 4/2005 | McFarland | |
| 2005/0161662 A1 | 7/2005 | Majumdar et al. | |
| 2006/0030068 A1 | 2/2006 | Ashton et al. | |
| 2006/0102227 A1* | 5/2006 | McFarland | 136/255 |

OTHER PUBLICATIONS

Trail, Pamela A. and Bianchi, Albert B., "Monoclonal Antibody Drug Conjugates in the Treatment of Cancer," Current Opinion in Immunology, 11:584-588 (1999).

Johnson, R. Colin, "Scientists Activate Neurons with Quantum Dots," EE Times (Dec. 6, 2001). cited by other.

Mutzel, M. et al., " Atom Lithography with a Holographic Light Mask," Physical Review Letters, vol. 88, No. 8 (Feb. 25, 2002).

Wong, Ciintyu; Burgess, Joel P., "Modifying the Surface Chemisty of Silica Nano-Shells for Immunoassays," Journal of Young Investigators, Issue 1 (Jul. 2002).

Trail, Pamela A.; King, H. Dalton, Dubowchik, Gene M., "Monoclonal Antibody Drug Immunoconjugates for Targeted Treatment of Cancer," Cancer Immunol Immunother, 52:328-337 (2003).

Odornina, Sveltana et al., "Development of Potent Monoclonal Antibody Auristatin Conjugates for Cancer Therapy," Nature Biotechnology, vol. 21, No. 7, pp. 778-784, 941 (2003).

Kaul, Zeenia et al., "Mortalin Imaging in Normal and Cancer cells with Quantum Dot Immuno-Conjugates," Cell Research, 13(6): 503-507 (2003).

Sesay, Muctarr Ayoub Ph.D., "Monoclonal Antibody Conjugation via Chemical Modification," BioPharm International (Dec. 1, 2003).

Adams, Gregory P. Ph.D., et al. "Antibody-Based Therapy and Detection of Solid Tumors," Fox Chase Center 2003 Scientific Report.

Technical Resource, "Attach an Antibody Onto Glass, Silica or Quartz Surface," Pierce Biotechnology, Inc. (Apr. 2004).

Harris, Marion, "Monoclonal Antibodies as Therapeutic Agents for Cancer," The Lancet Oncology, vol. 5, pp. 292-302 (May 2004).

Clube, FSM; Gray, S.; Struchen, D.; Tisserand, J. C.; Malfov, S., "Holographic Microlithography," Holotronic Technologies Ltd., Marin, Switzerland (accessed May 3, 2004).

Cattel, L., "Monoclonal Antibody as Carriers for Drug Targeting and Gene Therapy," University of Turin (accessed Jul. 6, 2004). cited by other.

Leonard, John P. MD. "Cutting Edge Therapy: Monoclonal Antibody Treatment for Non-Hodgkin's Lymphoma," Lymphoma Information Network (1998-2001).

Appelbaum FR, "Antibody-targeted therapy for myeloid leukemia," Semin Hematol, Oct. 1999; 36 (4 Suppl 6): 2-8.

Pamela A. Trail and Albert B. Bianchi, "Monoclonal Antibody Drug Conjugates in the Treatment of Cancer," Bristol-Myers Squibb Pharmaceutical Research Institute, Princeton, NJ, USA pp. 584-588.

R. Colin Johnson, "Scientists Activate Neurons with Quantum Dots," EE Times, Dec. 6, 2001, CMP Media LLC.

M. Mutzel et al., "Atom Lithography with a Holographic Light Mask," Institut fur Angewandte Physik, Universitat Bonn, Wegelerstrasse 8, D-53115 Bonn, Germany, vol. 88, No. 8, pp. 1-4.

Clintyu Wong, Joel P. Burgess, "Modifying the Surface Chemisty of Silica Nano-Shells for Immunoassays," Journal of Young Investigators, Issue 1, Jul. 2002.

Pamela A. Trail, H. Dalton King, Gene M. Dubowchik, "Monoclonal Antibody Drug Immunoconjugates for Targeted Treatment of Cancer," Symposium in Writing, Cancer Immunol Immunother (2003).

Sveltana Odornina et al., "Development of Potent Monoclonal Antibody Auristatin Conjugates for Cancer Therapy," Nature Biotechnology, Nature Publishing Group, 2003, vol. 21, No. 7.

Zeenia Kaul et al., "Mortalin Imaging in Normal and Cancer cells with Quantum Dot Immuno-Conjugates," National Institute of Advanced Industrial Science and Technology (AIST) Ibaraki, Japan.

Muctarr Ayoub Sesay, Ph.D., "Monoclonal Antibody Conjugation via Chemical Modification," BioPharm International, Dec. 1, 2003.

Gregory P. Adams, Ph.D., et al. "Antibody-Based Therapy and Detection of Solid Tumors," Fox Chase Center 2003 Scientific Report.

Technical Resourse, "Attach an Antibody Onto Glass, Silica or Quartz Surface," Pierce, Pierce Biotechnology, Inc.

Marion Harris, "Monoclonal Antibodies as Therapeutic Agents for Cancer," The Lancet Oncology, vol. 5, May 2004, pp. 292-302.

FSM Clube, S. Gray, D. Struchen, J C Tisserand and S. Malfov, "Holographic Microlithography," Holotronic Technologies Ltd., Marin, Switzerland.

L. Cattel, "Monoclonal Antibody as Carriers for Drug Targeting and Gene Therapy," Point Source, University of Turin.

Seattle Genetics, "Antibody-Drug Conjugates," ADC Publications.

John P. Leonard, Md. "Cutting Edge Therapy: Monoclonal Antibody Treatment for Non-Hodgkin's Lymphoma," Lymphoma Information Network, 1998-2001.

* cited by examiner

NANOPHOTOVOLTAIC DEVICES

RELATED APPLICATIONS

The present application is a continuation application of U.S. patent application Ser. No. 12/388,895, filed on Feb. 19, 2009, which is in turn a divisional application of U.S. patent application Ser. No. 11/002,850, filed on Nov. 30, 2004, which are herein incorporated by reference in their entirety.

BACKGROUND OF THE INVENTION

The present invention is directed generally to nanometer-sized quantum structures, and more particularly to such structures that can be selectively activated to perform a desired function, for example, apply a voltage to biological cells in proximity thereof or attached thereto.

Nanometer-sized or micrometer-sized semiconductor structures can be employed in a variety of applications, such as light-emitting devices and photodetectors. Despite the recent rapid developments in designing novel nanometer-sized and micrometer-sized quantum structures, and incorporating them into a variety of systems, a need still exists for improved nanometer-sized and micrometer-sizes structures that can reliably perform selected functions in response to specific stimuli.

SUMMARY OF THE INVENTION

In one aspect, the present invention provides a nanophotovoltaic device, herein also referred to as an active nanoparticle or simply a nanoparticle, that includes a semiconductor structure and a metallic layer disposed on at least a portion of the semiconductor structure to form a junction (e.g., a Schottky barrier junction) therewith such that the junction generates a space charge region. The photovoltaic device can have a size in a range of about 50 nm to about 5 microns, and preferably in a range of about 100 nm to 1000 nm.

Exposure of the nanoparticle to radiation having a selected wavelength can cause generation of electron-hole pairs therein. The space charge region associated with the semiconductor/metal junction supports an electric field that can cause separation of these electron-hole pairs to facilitate generation of a voltage across the device.

In another aspect, the semiconductor structure can be suitably doped silicon or germanium. For example, the semiconductor structure can include p-type or n-type silicon with a doping level in a range of about $10^{15}$ to about $10^{20}$ cm$^{-3}$. Alternatively, the semiconductor structure can include a Group III-V semiconductor compound, such as, GaAs and GaN. Preferably, the semiconductor structure is formed of a biocompatible material.

More generally, semiconductors useful in producing the nanophotovoltaic devices of the present invention can include Group II-VI, III-V and group IV semiconductors. (Alternatively, using the new IUPAC system for numbering element groups, suitable semiconductor materials include, but not limited to, the following: materials composed of a first element selected from Group II of the Periodic Table of the Elements and a second element selected from Group 2 or 12 of the Periodic Table of Elements and a second element selected from Group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and the like); materials composed of a first element selected from Group 13 of the Periodic Table of the Elements and a second element selected from Group 15 (GaN, GaP, GaAs, GaSb, InN, InP, InAs, InSb, AlS, AlP, AlAs, AlSb, and the like); materials composed of a Group 14 element (Ge, Si, and the like); Group IV-VI materials such as PbS, PbSe and the like; and alloys and mixtures (including ternary and quaternary mixtures) thereof.

In a related aspect, the metallic layer can comprise any suitable metal, and preferably, a metal that is biocompatible. Some examples of metals suitable for forming the metallic layer include, without limitation, gold, silver, platinum, titanium, palladium, and alloys thereof.

In yet another aspect, the semiconductor structure of the nanoparticle can exhibit a bandgap with a bandgap energy in a range of about 0.5 eV to about 2 eV. Such a nanoparticle can be exposed to radiation with one or more wavelength components that substantially correspond to the bandgap energy to excite electrons from the semiconductor's valence band to its conduction band, thereby generating a plurality of electron-hole pairs. Preferably, the activating radiation can include wavelength components in a range of about 400 nm to about 2000 nm. Preferably, the wavelength components lie in the infrared portion of the electromagnetic spectrum, for example, in a range of about 600 nm to about 1100 nm, that can pass through a patient's skin and/or other tissue to activate nanoparticles previously administered to the patient, as discussed in more detail below.

In another aspect, an electrically insulating layer having a thickness in a range of about 5 angstroms to about 500 angstroms, and more preferably in a range of about 50 to about 100 angstroms, can coat at least a portion of the nanoparticle's semiconductor structure. For example, when the nanostructure comprises silicon, a thin layer of silicon oxide ($SiO_2$) having a thickness in a range of about 5 to about 10 nanometers can coat the circumferential surface of the semiconductor structure (i.e., the surface extending between the metallic layers) so as to passivate that surface.

In further aspects, a plurality of ligands can be coupled to at least a portion of the nanoparticle's surface, for example, by forming covalent bonds therewith. For example, the ligands can be attached to the nanoparticle's surface via linker compounds previously coupled to that surface. The ligands can have affinity for certain biological cells, for example, certain cancer cells, to allow the associated nanoparticles to attach to those cells. For example, the ligands can include an antibody that can attach to selected trans-membrane receptor proteins of a cell type of interest, such as, a particular tumor cell, thereby anchoring the corresponding nanoparticles to these cells.

The nanoparticles are preferably biocompatible and can be injected into a selected tissue, e.g., cancerous tissue, and activated, for example, by irradiation at a suitable wavelength, to cause generation of a voltage across them. An electric field associated with the induced voltage can be experienced by tissue cells in vicinity of the nanoparticles or attached thereto. The applied electric field can be sufficiently high so as to disrupt functioning of the cells or cause their death.

In another aspect, the invention provides a nanophotovoltaic device having a semiconductor structure that comprises a p-n junction formed by adjacent semiconductor p-doped and n-doped portions. The p-n junction can provide a space charge region that can facilitate separation of electron-hole pairs generated in the nanoparticle, in response to exposure to a radiation having a suitable wavelength, so as to generate a voltage across the nanoparticle. The semiconductor structure can have a size in a range of about 50 nm to about 5 microns, and preferably in a range of about 100 nm to about 1000 nm. The nanoparticle can further include a pair of metallic layers, each disposed on a portion of the semiconductor structure to form an ohmic contact therewith. In some embodiments, at least one ligand, which has affinity for cells of a selected type, can be coupled to an external surface of the nanoparticle.

In a related aspect, the semiconductor structure can include, without limitation, silicon, germanium or a Group III-V semiconductor compound, or any of the other semiconductor compounds recited above. Further, each of the p-doped portion and the n-doped portion can have a doping level in a range of about $10^{15}$ to about $10^{20}$ cm$^{-3}$, and more preferably in a range of about $10^{17}$ to about $10^{19}$ cm$^{-3}$.

In a related aspect, the metallic layers can be formed of any suitable metal, such as, gold, silver, platinum, titanium, palladium, tungsten or alloys thereof. Further, the metallic layers can have a thickness in a range of about 100 angstroms to about 1 micron, and more preferably in a range of about 100 angstroms to about 500 angstroms.

An electrically insulating coating having a thickness in a range of about 5 to about 10 nm, can cover at least a portion of an external surface of the nanoparticle. For example, the insulating layer can extend from one metallic layer to the other so as to coat an external circumferential surface of the nanoparticle, or a portion thereof. For example, when the semiconductor structure comprises silicon, a coating of silicon oxide can cover at least a portion of its circumferential surface. The nanoparticle can be irradiated with radiation having a wavelength that substantially corresponds to a bandgap of the semiconductor portion so as to generate electron-hole pairs. Without limitation, some suitable wavelengths can lie in a range of about 400 nm to about 2000 nm, or preferably in a range of about 600 nm to about 1100 nm.

In yet another aspect, the invention provides a semiconductor nanoparticle that includes an n-doped semiconductor portion having a largest dimension in a range of about 50 nm to about microns, and a p-doped semiconductor portion, also having a largest dimension in a range of about 50 nanometers to about 5 microns, that is disposed adjacent to the n-doped portion so as to generate a p-n junction therewith. The n-doped and the p-doped portions can be formed of silicon, germanium, or a any other suitable semiconductor compound, such as those recited above.

BRIEF DESCRIPTION OF THE DRAWINGS

FIG. 3 is a flow chart depicting various steps in exemplary methods according to one embodiment of the invention for fabricating nanophotovoltaic devices, FIG. 4A schematically depicts a semiconductor-on-insulator (e.g., SIMOX) wafer that can be utilized for fabricating nanophotovoltaic devices according to the teachings of the invention, FIG. 4B schematically depicts a p-n junction formed in an upper silicon layer of the SIMOX wafer of FIG. 4 during one of the processing steps depicted in the flow chart of FIG. 3, FIG. 4C schematically depicts a thin metallic layer formed over an upper silicon layer of the SIMOX wafer shown in FIG. 4A to form a Schottky barrier junction or an ohmic contact layer with the underlying semiconductor layer, FIG. 5A schematically depicts the wafer shown in FIG. 4C mounted upside down to a support wafer via the thin metallic layer by employing a dissolvable adhesive, FIG. 5B schematically depicts the wafer of FIG. 5A with its bulk silicon portion removed during a processing step listed in the flow chart of FIG. 3, FIG. 6A schematically depicts the wafer of FIG. 5B with the continuous buried oxide layer of the original SIMOX wafer removed during a processing step listed in the flow chart of FIG. 3 to expose a back surface of the SIMOX wafer's upper silicon layer, FIG. 6B schematically depicts the semiconductor structure of FIG. 6A with a thin metallic layer deposited over the exposed surface of the original SIMOX wafer's upper silicon layer to form an ohmic contact therewith, FIG. 7A schematically depicts a relief layer disposed over the exposed metallic layer of the semiconductor structure of FIG. 6B during a processing step in the flow chart of FIG. 3 to provide exposed and unexposed portions of the surface underlying the relief layer, FIG. 7B schematically depicts a semiconductor structure generated by etching away the portions of the semiconductor structure of FIG. 7A in register with the openings of the relief layer during one processing step in the flow chart of FIG. 3, FIG. 8A schematically depicts the semiconductor structure of FIG. 7B with the resist portions removed as a plurality of nanophotovoltaic devices anchored to the support wafer, FIG. 8B schematically depicts a plurality of individual nanophotovoltaic devices according to the teachings of the invention generated by releasing the devices of FIG. 8A from the support wafer, FIG. 9 schematically illustrates a nanophotovoltaic device according to the teachings of the invention electrically coupled to an external load for supplying a current thereto upon activation by electromagnetic radiation having selected wavelength components.

DETAILED DESCRIPTION

The present invention is directed generally to nanophotovoltaic devices, herein also referred to as active nanoparticles or simply nanoparticles, that can exhibit a desired effect in response to activation. For example, a voltage can be induced across the nanoparticles by irradiating them with radiation having suitable wavelength components. For example, radiation with wavelength components in a range of about 400 nm to about 2000 nm can be employed. In some embodiments, the nanoparticles include ligands that allow them to couple to a cell type of interest. The attached nanoparticles can be activated to apply a voltage across the cells to which they are anchored so as to cause a desired therapeutic effect.

The nanoparticles described in the following embodiments of the invention can be classified broadly as belonging to two categories. In one category, the nanoparticles include a semiconductor core and two metallic layers disposed on selected portions of the core such that one metallic layer forms a Schottky barrier junction with the underlying semiconductor core and the other forms an ohmic contact therewith. In the other category, the nanoparticles include a semiconductor core comprising a p-n junction and two metallic layers that are disposed on the semiconductor core to form ohmic contacts therewith. In both cases, the junctions (a Schottky barrier junction or p-n junction) can be characterized by an internal electric field in proximity thereof that can facilitate separation of electron-hole pairs generated in response to exposure of the core to activating radiation having suitable wavelength components.

Figure 1A:
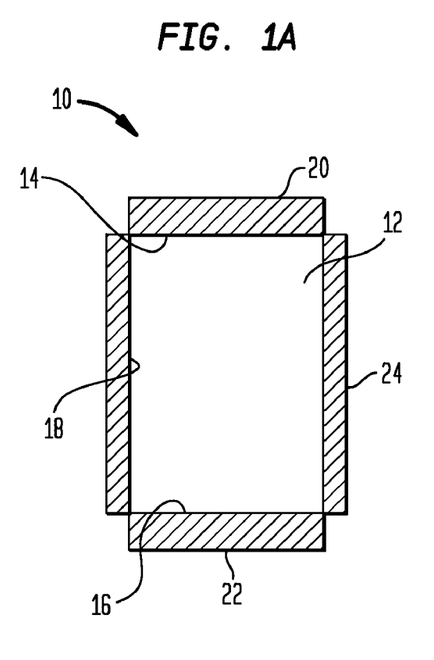
FIG. 1A presents a schematic cross-sectional view of a nanophotovoltaic device according to one embodiment of the invention having a Schottky barrier junction.
Figure 1B:
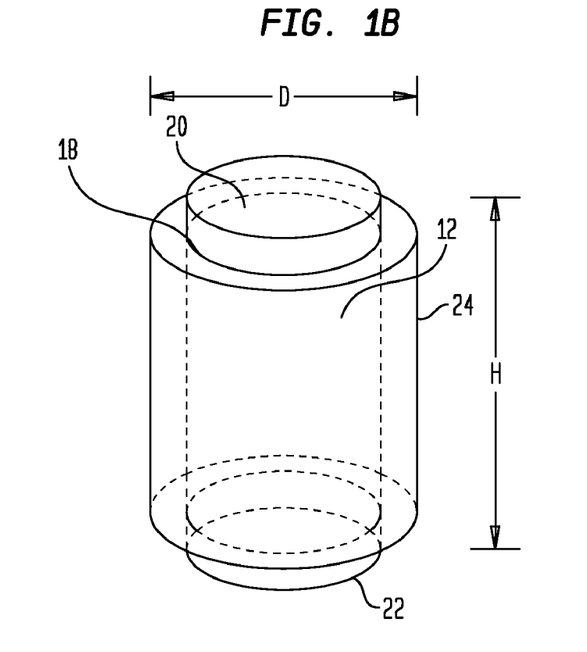
FIG. 1B illustrates a perspective view of the nanophotovoltaic device shown in FIG. 1A.

By way of example, FIGS. 1A and 1B schematically depicts a nanophotovoltaic device 10 according to one embodiment of the invention that includes a core 12 formed of a suitable semiconductor—preferably a biocompatible semiconductor material. In some embodiments, the semiconductor core is formed of silicon or germanium. In other embodiments, the semiconductor core is formed of any suitable Group III-V semiconductors. More generally, semiconductors useful in producing the nanophotovoltaic devices of the present invention can include Group II-VI, III-V and group IV semiconductors. (Alternatively, using the new IUPAC system for numbering element groups, suitable semiconductor materials include, but not limited to, the following: materials composed of a first element selected from Group 2 or 12 of the Periodic Table of the Elements and a second element selected from Group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and the like); materials composed of a first element selected from Group 13 of the Periodic Table of the Elements and a second element selected from Group 15 (GaN, GaP, GaAs, GaSb, InN, InP, InAs, InSb, AlS, AlP, AlAs, AlSb, and the like); materials composed of a Group 14 element (Ge, Si, and the like); Group IV-VI materials such as PbS, PbSe and the like; and alloys and mixtures (including ternary and quaternary mixtures) thereof.

The semiconductor core 12 can have p-type or n-type doping with a doping level in a range of about $10^{15}$ to about $10^{20}$ cm$^{-3}$, and more preferably in a range of about $10^{17}$ to about $10^{19}$ cm$^{-3}$. For example, the core can be formed of n-type silicon (e.g., silicon doped with phosphorous) or p-type silicon (e.g., silicon doped with boron). The semiconductor core can have any suitable shape, such as, cylindrical, cubic, boxlike, or spherical.

In this embodiment, the semiconductor core has a cylindrical shape having two opposed, and substantially flat, surfaces 14 and 16 that are separated by a curved circumferential surface 18. Two metallic layers 20 and 22 are disposed, respectively, on the surfaces 14 and 16 such that one of the metallic layers, e.g., the layer 20, forms a barrier junction characterized by a space charge region (e.g., a Schottky barrier junction) with the underlying semiconductor surface, and the other metallic layer, e.g., layer 22, forms an ohmic contact with its respective underlying semiconductor surface. The metallic layers, which are preferably biocompatible, can include, for example, gold (Au), silver (Ag), platinum (Pt), titanium (Ti) and palladium-gold (Pd—Au) alloy.

As discussed in more detail below, the space charge region associated with the barrier junction can facilitate separation of electron-hole pairs that can be generated by exposing the nanoparticle to radiation having selected wavelength components.

In this embodiment, a protective insulating layer 24, which can have a thickness in a range of about 5 nm to about 10 nm, circumferentially surrounds the core 12. For example, when the core 12 is formed of silicon, the protective oxide layer can be SiO$_2$.

The exemplary nanophotovoltaic device 10 can have a height H in a range of about 50 nm to about 5 microns, and more preferably in a range of about 100 nm to about 1 micron, and a diameter D in a range of about 50 nm to about 5 microns, and more preferably in a range of about 100 nm to about 1 micron.

Figure 2A:
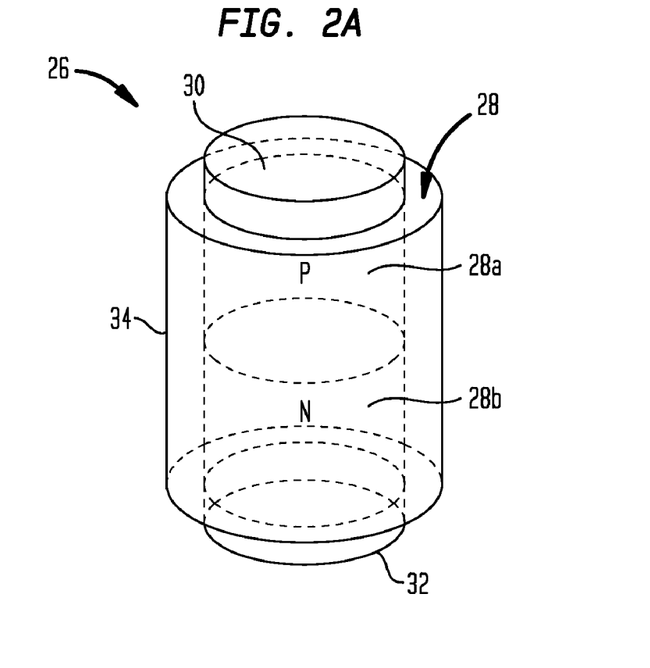
FIG. 2A is a schematic perspective view of a nanophotovoltaic device according to another embodiment of the invention having a p-n junction sandwiched between two ohmic metallic layers.
Figure 2B:
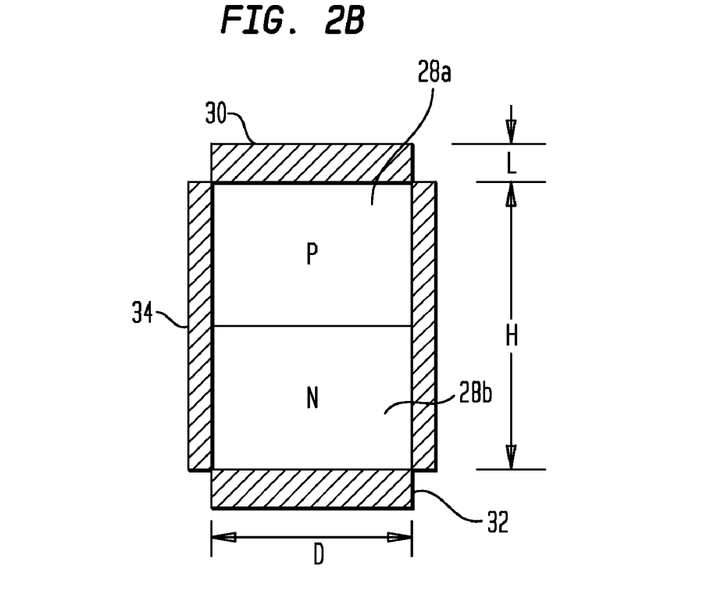
FIG. 2B is a schematic cross-sectional view of the nanophotovoltaic device of FIG. 2A.

As noted above, another class of nanophotovoltaic devices according to the teachings of the invention include a semiconductor portion that comprises a p-n junction. For example, FIGS. 2A and 2B schematically illustrate a perspective view and a cross-sectional view, respectively, of such a nanophotovoltaic device 26 in accordance with another embodiment of the invention that includes a semiconductor structure 28 comprising an n-doped semiconductor portion 28a that forms a p-n junction with a p-doped semiconductor portion 28b. The semiconductor structure 28 is sandwiched between two metallic layers 30 and 32, each of which forms an ohmic contact with an underlying semiconductor surface. The semiconductor structure can have a height H in a range of about 50 nm to about 5 microns, and preferably in a range of about 100 nm to about 1 micron, and a diameter D in a range of about 50 nm to about 5 microns, and preferably in a range of about 100 nm to about 1 micron. Further, each metallic layer can have a thickness in a range of about 100 angstroms to about 1 micron.

The semiconductor portions can be formed, for example, of silicon (Si), germanium (Ge), a Group III-V semiconductor compound or any suitable semiconductor material, such as those listed above. For example, the n-doped portion can be formed of silicon that is doped with a donor (e.g., phosphorus) having a concentration, for example, in a range of about $10^{15}$ to about $10^{20}$, and preferably in a range of about $10^{17}$ to about $10^{19}$ cm$^{-3}$. And the p-doped portion can be formed of silicon that is doped with an acceptor (e.g., boron) having a concentration, for example, in a range of about $10^{15}$ to about $10^{20}$ cm$^{-3}$, and preferably in a range of about $10^{17}$ to about $10^{19}$ cm$^{-3}$. The metallic layers can be formed of any suitable metal—preferably biocompatible—that can generate a reliable ohmic contact with the underlying semiconductor surface. For example, titanium (Ti), palladium (Pd), gold (Au), silver (Ag) or alloys thereof (e.g., Ti—Pd—Au alloy) can be employed for forming the metallic layers.

Similar to the previous embodiment, a passivating insulating layer 34, e.g., a layer of SiO$_2$, can circumferentially surround the semiconductor core structure 28. This coating layer can have a thickness in a range of about 5 angstroms to about 500 angstroms, or preferably in a range of about 50 angstroms to about 100 angstroms.

Figure 3:
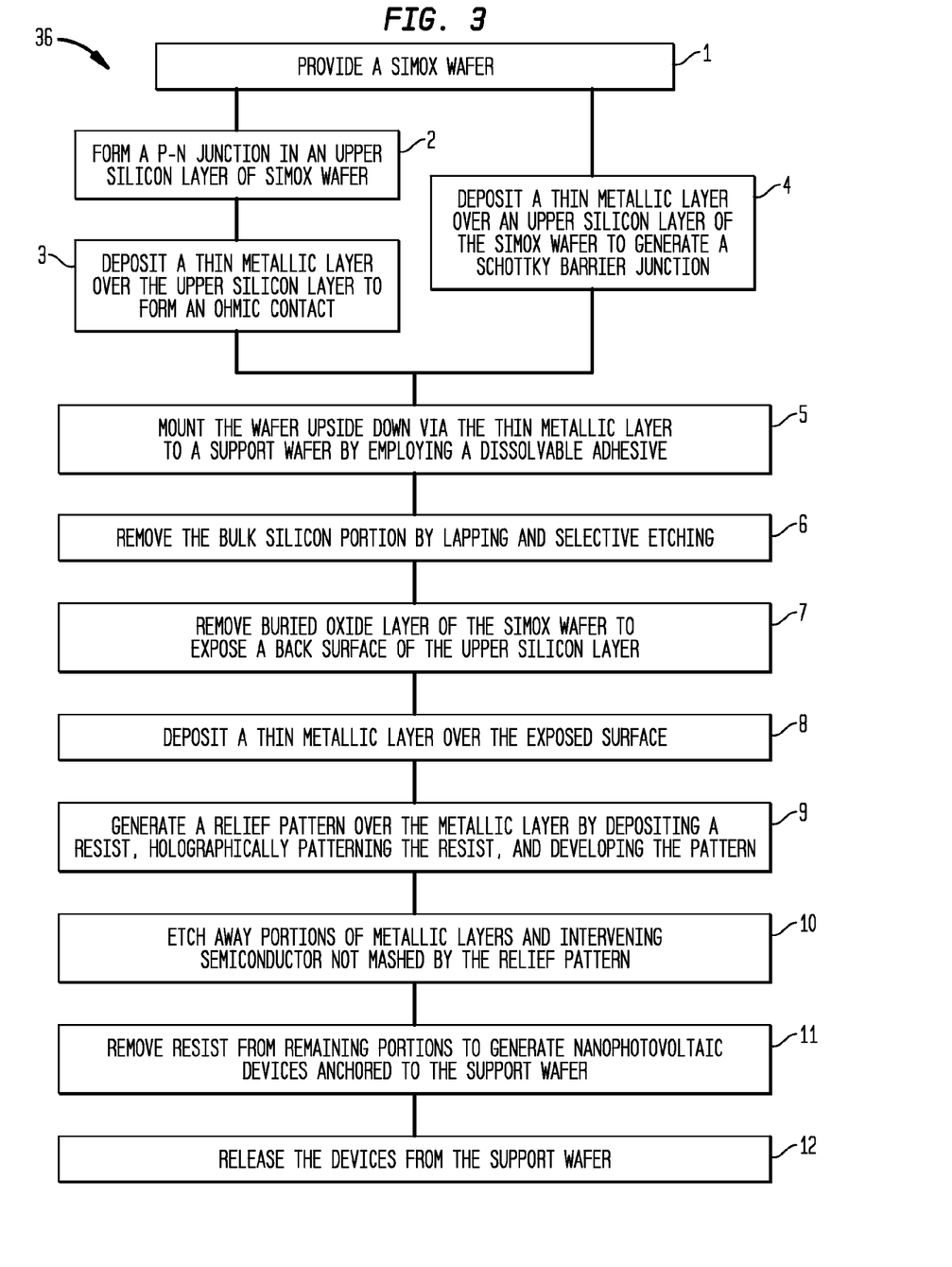
Figure 4A:
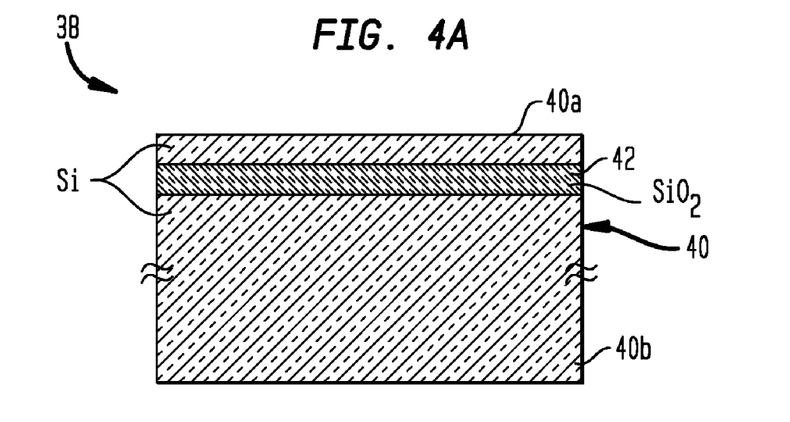

With reference to a flow chart 36 of FIG. 3 and schematic diagrams of FIGS. 4A-8B, in exemplary methods according to the teachings of the invention for fabricating the above nanoparticle 10 having a Schottky barrier junction and the above nanoparticle 26 having a p-n junction, in an initial step 1, a semiconductor-on-insulator (e.g., SIMOX) wafer 38, shown schematically in FIG. 4A, is procured. A semiconductor-on-insulator wafer can include a semiconductor wafer having a buried insulating layer that separates an upper portion from the bulk of the wafer. For example, as is known in the art, the SIMOX wafer 38 comprises a silicon substrate 40 in which a continuous buried oxide layer 42 that functions as an electrically insulating layer is formed to separate an upper silicon segment 40a from the bulk of the substrate 40b. Such SIMOX and bonded silicon-on-insulator wafers are well known in the art and are commercially available.

Figure 4B:
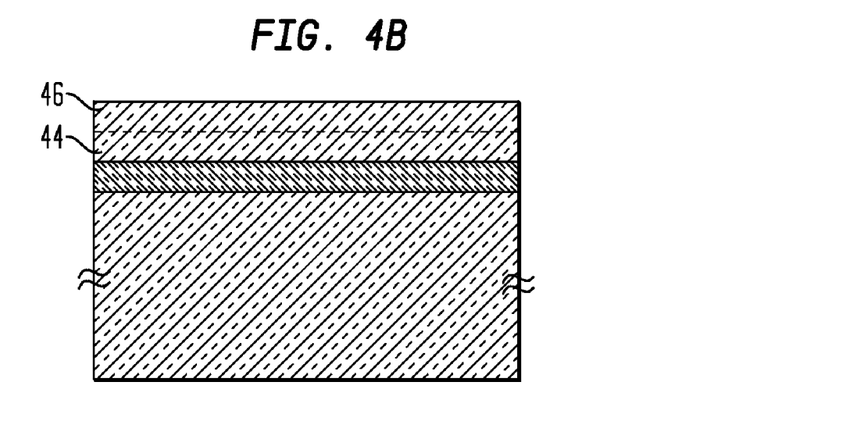

For fabricating a nanoparticle having a p-n junction, in step 2, a p-n junction is formed in the upper silicon portion 40a of the SIMOX wafer by utilizing known techniques, such as ion implantation, or known epitaxial growth techniques. For example, donor ions (such as phosphorous) can be implanted in the upper silicon portion of a p-doped SIMOX wafer to generate an n-doped layer 44 adjacent a p-doped layer 46 within a section of the upper silicon layer, as shown schematically in FIG. 4B. The energy of the ions can be selected in a manner known in the art to ensure that the ion deposition peak lies in a selected region of the upper segment, thereby generating the n-doped portion 44 below the p-doped portion 46. When the initial wafer is selected to include acceptor ions (p-type silicon), the dosage of the implanted donor ions in a region to be rendered n-doped is selected to be sufficiently high so as to generate donor states having a concentration that is higher than that of previously present acceptor states.

Figure 4C:
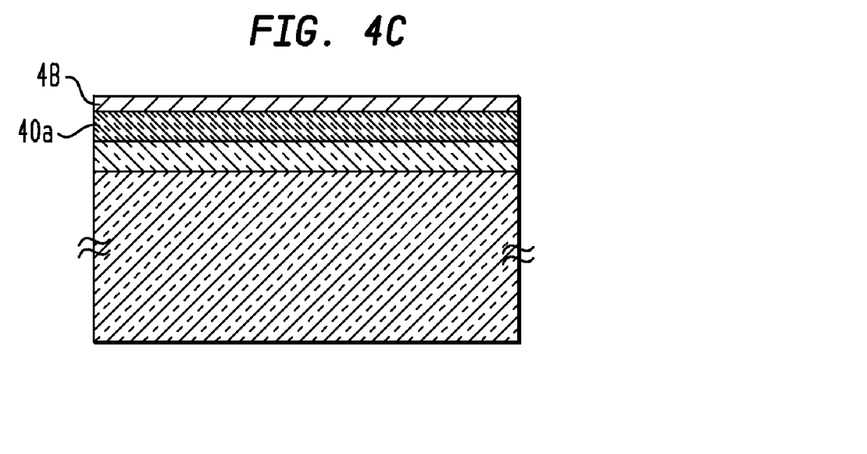

With continued reference to the flow chart 36, in step 3, a thin metallic layer 48, having a thickness in a range of about 100 angstroms to about 1 micron, and more preferably in a range of about 100 angstroms to about 500 angstroms is deposited over a top surface of the silicon segment comprising the p-n junction to form an ohmic contact layer therewith, as shown schematically in FIG. 4C. The metallic layer is preferably biocompatible, for example, gold, silver, platinum, or any other suitable metal, and can be formed, for example, by sputtering or evaporating a selected metal in a manner known in the art onto the underlying semiconductor surface, or by employing any other suitable technique. In some embodiments, the metallic layer 48 includes a multi-layer structure. For example, initially a thin layer, e.g., 50 angstroms, of titanium is deposited over the semiconductor surface to provide enhanced adhesion of a subsequent gold layer, e.g., about 100 angstroms thick, deposited over the titanium layer.

Referring again to the flow chart 36, for fabricating nanoparticles having Schottky barrier junctions, in step 4, the metallic layer 48 (FIG. 4C) deposited over a top surface of the SIMOX wafer is selected so as to generate a Schottky barrier junction between the metallic layer and the underlying silicon surface. Any suitable metal—preferably biocompatible—that is capable of forming a Schottky barrier junction with the underlying semiconductor layer can be employed. In many embodiments, metals having Schottky barrier heights that are about ⅔ of the bandgap of the underlying semiconductor are employed. The metallic Schottky barrier layer can have a thickness in a range of about 100 angstroms to about 1 micron, or preferably in a range of about 100 angstroms to about 500 angstroms.

As fabrication of nanoparticles having p-n junctions and those having Schottky barrier junctions have the following remaining processing steps in common, these steps will be described below without regard to the presence or absence of a p-n junction in the upper silicon segment of the SIMOX wafer.

Figure 5A:
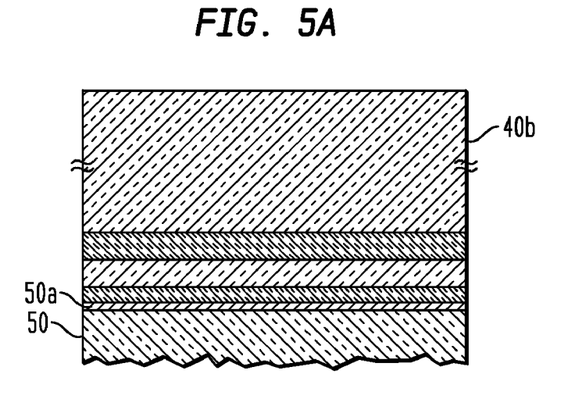
Figure 5B:
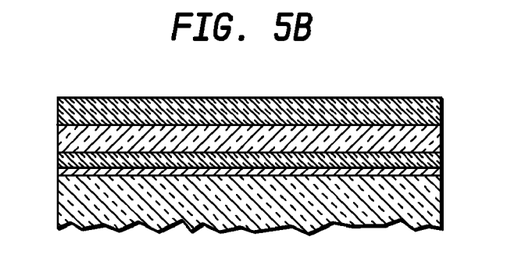

More specifically, referring again to the flow chart 36, subsequent to deposition of the thin metallic layer to form an ohmic contact or a Schottky barrier junction, in step 5, the silicon substrate is mounted upside down, via the deposited metallic layer, on a silicon support wafer 50 by employing a dissolvable adhesive layer 50a, such as epoxy, as shown schematically in FIG. 5. Subsequently, in step 6, the bulk silicon portion 40b of the SIMOX wafer is removed, for example, by lapping and selective etching until the silicon dioxide layer, which can be employed as the etch stop, is reached, as shown schematically in FIG. 5B.

Figure 6A:
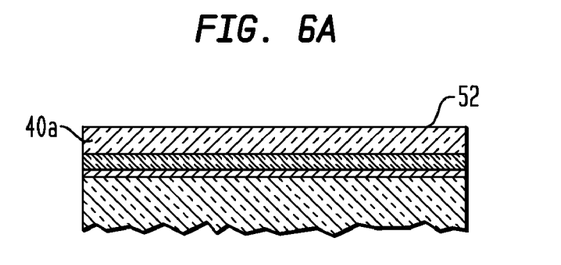
Figure 6B:
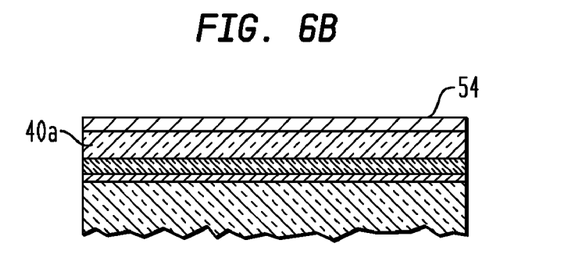

Subsequently, in step 7, the silicon dioxide layer can be etched away by employing dry etching techniques or other suitable techniques, such as etching in BHF, so as to expose a surface 52 of the upper silicon portion 40, as shown schematically in FIG. 6A. This is followed by depositing a thin metal layer 54 (shown schematically in FIG. 6B) over the exposed portion to form an ohmic contact therewith. The metallic layer can have a thickness in a range of about 100 angstroms to about 1 micron.

Figure 7A:
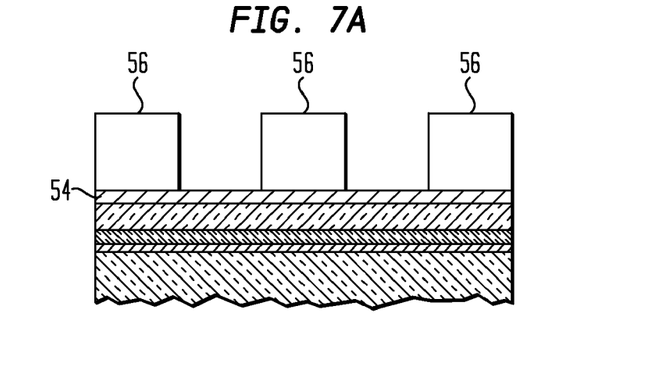

Subsequently, in step 9, a relief pattern 56, shown schematically in FIG. 7A, providing exposed and unexposed portions of the underlying surface can be formed over the metallic layer 54 by depositing a photoresist layer over the metallic surface, holographically patterning the resist, and developing the pattern. More specifically, a photoresist can be spin-cast over the surface and exposed to a holographic line grating, rotated by 90 degrees, and exposed again. Alternatively, a single exposure to a two-dimensional holographic pattern can be employed. The exposed photoresist can then be developed in a manner known in the art to generate the relief pattern 56. The use of holographic lithography in generating the relief pattern can be advantageous as it allows obtaining a relief pattern with a resolution, e.g., a 1000 nm, commensurate with the size of nanoparticles produced in subsequent processing steps, as discussed below.

Figure 7B:
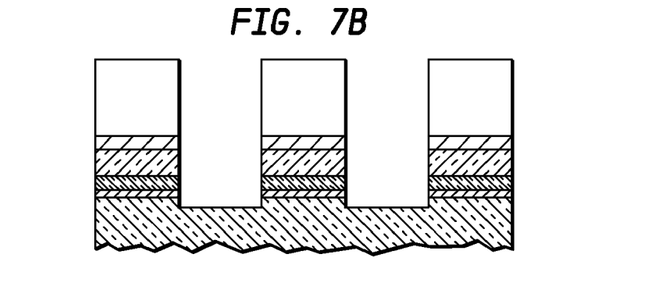

In step 10, the exposed portions of the semiconductor structure and the metallic layers, i.e., the portions not masked by the relief pattern can be, removed, e.g., via etching, as shown schematically in FIG. 7B. For example, a dry etching process, such as those known in the art, can be employed to etch away the exposed portions of the thin ohmic metallic layer 54, the underlying thin silicon layer 40a, and the thin ohmic (or Schottky) metallic layer 48. The etching process can be terminated upon reaching the adhesive layer 50a or the support wafer 50.

Figure 8A:
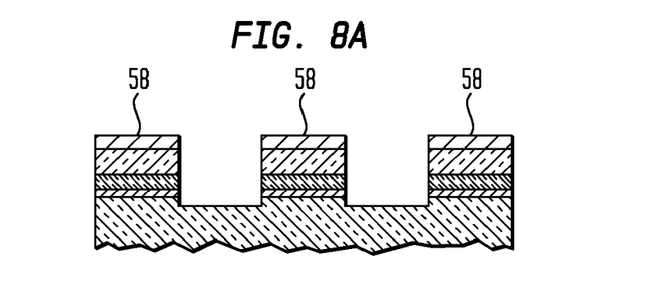
Figure 8B:
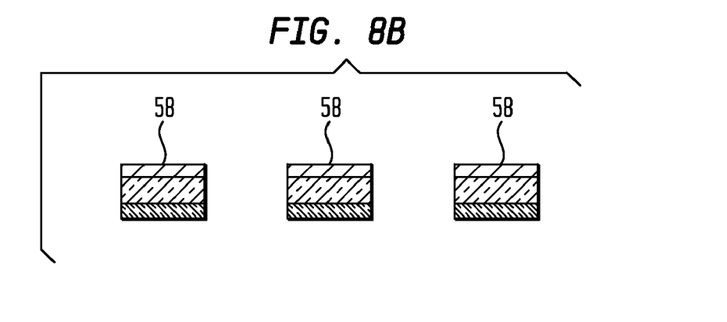

Subsequently, the remaining portions of the resist layer can be removed (step 11), for example, by dissolution in an appropriate solvent, to generate individual nanophotovoltaic devices (or nanoparticles) 58 anchored to the support wafer, as shown schematically in FIG. 8A. This is followed in step 12 by releasing the nanoparticles from the support wafer 50 by dissolving the adhesive in a suitable solvent.

In some embodiments of the invention, the nanoparticles are then oxidized to form a circumferential oxide layer, having a thickness in a range of about 5 angstroms to about 50 nm, or preferably in a range of about 5 nm to about 10 nm, that passivates the particles' exposed semiconductor surfaces. For example, in the present embodiment, the particles released from the support wafer can be placed in an oxidizing solution, for example, a peroxide solution, to cause a portion, and preferably substantially all, of the exposed circumferential semiconductor surface to oxidize, thereby forming a silicon oxide ($SiO_2$) layer. Alternatively, the nanoparticles can be exposed, e.g., while attached to the support 50, to a high temperature oxidizing environment to cause their exposed semiconductor surfaces to oxidize.

Figure 9:
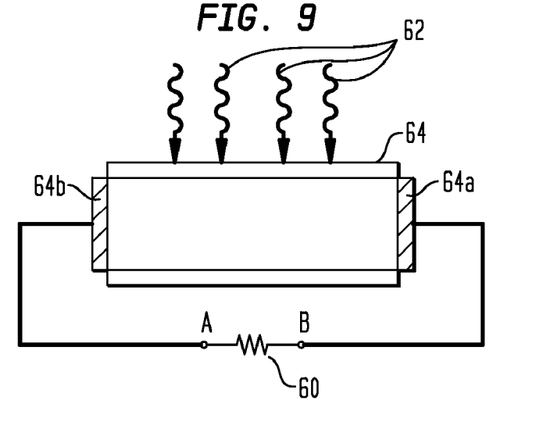

The nanophotovoltaic devices formed according to the above embodiment of the invention, such as the above nanophotovoltaic devices 10 and 26, can find a variety of applications. For example, as shown schematically in FIG. 9, the nanophotovoltaic devices can be utilized to generate an electrical current in a load 60, in response to exposure to radiation 62 having suitable wavelength components. For example, a nanophotovoltaic device 64 according to the teachings of the invention can be coupled in series with the load 60 by electrically connecting its metallic layers 64a and 64b to terminals A and B of the load, respectively. Electron-hole pairs can be created in the particle's semiconductor core by exposing it to radiation having suitable wavelength components, e.g., wavelengths corresponding to energies that substantially match, or are greater than, the semiconductor bandgap energy. The space charge region in proximity of a junction within the semiconductor core, e.g., a p-n junction, or between the semiconductor core and one of the metallic layers, e.g., a Schottky barrier junction, facilitates separation of these electron-hole pairs so as to generate a voltage across the particle, and hence a current through the external load 60. For example, electron-hole pairs can be generated in a semiconductor core formed of silicon that exhibits, for example, a direct bandgap energy of about 1.12 eV at 300 K by irradiating it with radiation having wavelengths commensurate with the bandgap.

In one application, the nanophotovoltaic devices of the invention, which can be biocompatible, can be injected into a diseased tissue, e.g., cancerous tissue, and be activated, via suitable radiation, to generate electric fields within that tissue for causing disruption of functioning of the tissue cells. In such applications, the activating radiation is preferably selected to penetrate the tissue. For example, radiation with wavelength components in a range of about 600 nm to about 1100 nm can be employed.

In another application, the nanophotovoltaic devices of the invention can be functionalized to attach to particular cell types to perform a variety of therapeutic actions. For example, in one embodiment, linking reactive groups can be attached to the particles' external surfaces to facilitate their coupling to a particular type of cancer cells in a human patient. The functionalized particles can be introduced into the patient to seek out and attach to the cancer cells. An external radiation source can then be utilized to irradiate the particles with radiation that passes through the patient's skin and can also generate electron-hole pairs in the nanoparticles. For example, radiation with wavelength components in a range of about 400 nm to 2000 nm, and preferably in a range of 600 nm to about 1100 nm, can be employed for this purpose. The space charge regions associated with the p-n or Schottky barrier junctions of the nanoparticles can facilitate separation of the electron-hole pairs, thereby generating a voltage across the particle that is applied to an attached cell. This applied voltage can disrupt functioning of the cell or cause its death.

Figure 10:
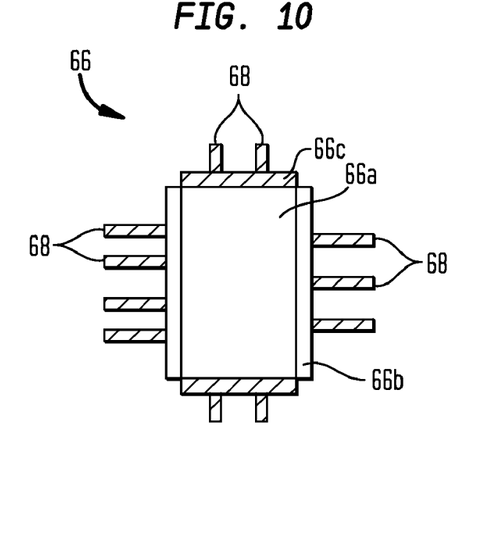
FIG. 10 is a schematic cross-sectional view of a nanophotovoltaic device according to one embodiment of the invention that includes a plurality of ligands attached to a portion of its outer surface, and FIG. 11 schematically depicts the nanophotovoltaic device of FIG. 10 attached to a cell via its ligands.

By the example, FIG. 10 schematically illustrates a nanoparticle 66 formed in accordance with one embodiment of the invention that, similar to the above nanoparticles 10 or 26, includes a semiconductor core 66a surrounded by a thin oxide layer 66b, and two metallic layers 66c and 66d disposed on two opposed surfaces of the semiconductor core. A plurality of ligands 68 are attached to the particle's external surface, for example, its circumferential oxide layer and/or its metallic layers.

Figure 11:
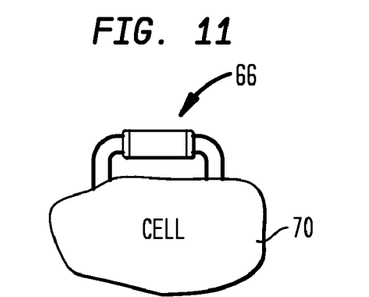

As shown schematically in FIG. 11, the exemplary ligands 68 facilitate coupling of the nanoparticle 66 to a cell 70, for example, a cancer cell. Illumination of the nanoparticle by radiation, for example, radiation in the infrared region of the electromagnetic spectrum, can cause generation of a voltage across the particle, and consequently across the cell to which the nanoparticle is attached. In this manner, a voltage can be applied to the cell so as to cause disruption of the cell's activity, or to cause its death.

A variety of ligands can be attached to the nano-particles, and a variety of techniques can be utilized for their attachment. While in some embodiments ligands of interest are directly coupled to a portion of the particle's surface, in other embodiments the ligands can be coupled to the particle's surface via linker molecules providing a biocompatible coating of the surface. Further, in some embodiments, at least a portion of the particle's external surface, e.g., the circumferential portion, can be activated to facilitate coupling of the linker molecules and/or the ligands thereto. Such surface activation can lead to modification of one or more surface characteristics, e.g., it may render the surface more hydrophilic or more hydrophobic, so as to facilitate its subsequent functionalization. One example of surface activation includes forming an oxide layer over at least a part of the particle's semiconductor circumferential surface. Exemplary methods for forming such an oxide layer were described above. Other suitable methods of surface activation, such as, exposure to an ECR plasma or ion implantation, are described in a commonly owned co-pending patent application entitled "Surface Activation of Semiconductor Nanostructures for Biological Applications," which is herein incorporated by reference in its entirety.

The coupling of the biological ligands and/or the linker molecules to a nanophotovoltaic device formed in accordance with the teachings of the invention can be achieved, for example, via formation of a covalent or a non-covalent bond (e.g., an ionic bond) as well as van der Walls interactions, or other interactions known in the art.

Some exemplary biological ligands suitable for coupling to photovoltaic particles formed in accordance with the teachings of the invention can include, without limitation, proteins, peptides, nucleic acids, polysaccharides, antibodies or antibody fragments, and antigens. In some embodiments, the nanoparticles are immersed in a solution containing a selected quantity of ligand molecules of interest so as to cause coupling of the ligand molecules to the particles' surfaces.

In some embodiments of the invention, the ligands coupled to the photovoltaic particles include antibodies, or antibody fragments, that can selectively attach to a cell type of interest. By way of example, such antibodies, or antibody fragments and constructs, can target tumor-associated antigens of a particular cancer type.

Those having ordinary skill in the art will appreciate that various modifications can be made to the above embodiments without departing from the scope of the invention.

What is claimed is:

1. A method of forming nanophotovoltaic devices, comprising providing a semiconductor-on-insulator wafer having a continuous buried insulating layer separating a thin upper layer from the bulk of the wafer, forming a p-n junction in said upper wafer layer, depositing a first metallic layer on an exposed surface of said thin upper layer so as to form an ohmic contact therewith, removing the bulk portion of the wafer and said continuous insulating layer to generate a structure comprising said upper layer comprising a p-n junction and said metallic layer disposed on a surface thereof, depositing a second metallic layer on an exposed surface of said thin layer opposed to said first metallic layer to form an ohmic contact therewith, applying a photoresist to one of said metallic layers, holographically patterning said resist to generate a two-dimensional holographic recording therein, developing said patterned photoresist to generate a pattern of exposed and unexposed portions, and etching away the exposed portions to generate a plurality of nanophotovoltaic devices.

2. The method of claim 1, wherein said upper layer is initially p-doped and said step of forming a p-n junction comprises:

implanting donor ions in a portion of said upper silicon layer to generate an n-doped portion adjacent to a p-doped portion.

3. The method of claim 1, further comprising selecting said semiconductor-on-insulator wafer to be a SIMOX wafer.

4. The method of claim 3, further comprising selecting said insulating layer to be a buried oxide layer.

5. The method of claim 1, wherein said step of holographically patterning the resist comprises
   exposing the photoresist to a one-dimensional holographic line grating,
   rotating the wafer by 90 degrees, and
   exposing the photoresist to the line grating.

6. The method of claim 1, wherein said step of holographically patterning the resist comprises:
   exposing the photoresist to a two-dimensional grating pattern.

7. The method of claim 1, wherein said holographic patterning provides a resolution of about 1000 nm.

8. The method of claim 1, wherein the step of etching away the exposed portions comprises employing a dry etching process.

* * * * *